US012610844B1

(12) United States Patent
Rogers, IV et al.

(10) Patent No.: US 12,610,844 B1
(45) Date of Patent: Apr. 21, 2026

(54) SYSTEMS AND METHODS FOR ADDITIVE CONNECTIONS IN INTEGRATED CIRCUITS

(71) Applicant: EngeniusMicro, LLC, Huntsville, AL (US)

(72) Inventors: Charles Fredrick Rogers, IV, Huntsville, AL (US); Carl Anders Rudd, Huntsville, AL (US)

(73) Assignee: EngeniusMicro, LLC, Huntsville, AL (US)

( * ) Notice: Subject to any disclaimer, the term of this patent is extended or adjusted under 35 U.S.C. 154(b) by 352 days.

(21) Appl. No.: 18/304,101

(22) Filed: Apr. 20, 2023

(51) Int. Cl.
*H01L 23/00* (2006.01)
*H01L 21/56* (2006.01)
*H01L 23/31* (2006.01)

(52) U.S. Cl.
CPC .............. *H01L 24/32* (2013.01); *H01L 21/56* (2013.01); *H01L 23/3185* (2013.01); *H01L 24/29* (2013.01); *H01L 24/83* (2013.01); *H01L 2224/29139* (2013.01); *H01L 2224/29147* (2013.01); *H01L 2224/2919* (2013.01); *H01L 2224/29193* (2013.01); *H01L 2224/32225* (2013.01); *H01L 2224/834* (2013.01); *H01L 2224/83487* (2013.01); *H01L 2224/8349* (2013.01); *H01L 2224/83493* (2013.01); *H01L 2224/83888* (2013.01)

(58) Field of Classification Search
CPC ......... H01L 24/32; H01L 24/29; H01L 24/83; H01L 21/56; H01L 23/3185; H01L 2224/29139; H01L 2224/29147; H01L 2224/2919; H01L 2224/29193; H01L 2224/32225; H01L 2224/834; H01L 2224/83487; H01L 2224/8349; H01L 2224/83493; H01L 2224/83888
See application file for complete search history.

(56) References Cited

U.S. PATENT DOCUMENTS

2003/0116861 A1* 6/2003 Jeung ................... H01L 25/0657
257/778
2004/0155322 A1* 8/2004 Cho ................... H01L 23/49816
257/676
2006/0049527 A1* 3/2006 Hashimoto ....... H01L 23/49833
257/E23.125
2006/0103000 A1* 5/2006 Kurosawa ......... H01L 23/49827
257/E23.068

* cited by examiner

*Primary Examiner* — Peniel M Gumedzoe
(74) *Attorney, Agent, or Firm* — Bradley Arant Boult Cummings, LLP; Daniel E. Sineway, Esq.; Micah B. Hensley, Esq.

(57) ABSTRACT
A system and method for forming a bonded integrated circuit, comprising dispensing a dielectric material on a first side of an integrated circuit, shaping the dielectric material on the first side of the integrated circuit to form a first dielectric surface; and dispensing a conductive material between a first printed circuit board (PCB) top surface and a top surface of the integrated circuit to form a first connection, the first connection situated on the first dielectric surface.

11 Claims, 8 Drawing Sheets

100

323  322  321  101

104

331

301

311

302

312

102  313  303  107

SYSTEMS AND METHODS FOR ADDITIVE CONNECTIONS IN INTEGRATED CIRCUITS

STATEMENT REGARDING FEDERALLY SPONSORED RESEARCH OR DEVELOPMENT

This invention was made with government support under Contract No. W31P4Q-18-C-0001 awarded by Army Contracting Command. The government has certain rights in the invention.

TECHNICAL FIELD

The present apparatuses, systems, and methods relate generally to integrated circuit fabrication and, more particularly, to additive manufacturing techniques for integrated circuit fabrication.

BACKGROUND

Microfabrication design has become a vastly important field for electronic devices. Through the advent of advanced manufacturing procedures for microfabrication, virtually every electronic device contains some form of a microfabricated electronic system. Integrated circuits are commonly connected through wire-bonded connections. Wire-bonded connections have limitations in various applications. For example, wire bonding connections can produce a significant amount of power loss, noise, and are susceptible to relatively slow manufacturing procedures. Furthermore, wire bonding connections are not resilient to physically intense applications and are vulnerable to damage when placed under significant physical stress.

Therefore, there is a long-felt but unresolved need for a system or method that provides connections between integrated circuits and reduces power loss and noise, increases the resilience of the system when exposed to physical stress, and drastically increases the manufacturability of devices.

BRIEF SUMMARY OF THE DISCLOSURE

Briefly described, and according to one embodiment, aspects of the present disclosure generally relate to systems and methods for manufacturing a bonded integrated circuit. In various embodiments, forming the bonded integrated circuit includes adding dielectric material between at least one integrated circuit, a packaging substrate, and a series of PCB connections. In at least one embodiment, the integrated circuit electronically connects to various PCB connections, other integrated circuits, and/or any particular electronic infrastructure. The bonded integrated circuit may employ conductive material connections to connect the integrated circuit to the various components of the bonded integrated circuit. In particular embodiments, using dielectric surfaces and placing the conductive material connections on or within the dielectric material reduces power loss, noise, increases the resilience of the system when exposed to physical stress, and drastically increases the manufacturability of devices.

In certain embodiments, forming the bonded integrated circuit includes dispensing dielectric material at both sides of the integrated circuit. In a single integrated circuit configuration, the bonded integrated circuit may include dielectric surfaces at one or more sides of the integrated circuit. In at least one embodiment, the dielectric surfaces are milled to form ramp-like structures to support two or more conductive material connections between one or more integrated circuits and one or more PCB connections. In certain embodiments, a two or more integrated circuit configuration includes various dielectric surfaces that are dispensed and milled to connect each integrated circuit together. In some embodiments, the dielectric surfaces between the two or more integrated circuits are parallel to the top surface of each integrated circuit. In the two or more integrated circuit configuration, the bonded integrated circuit may include dielectric surfaces with ramp-like configurations between the integrated circuits and their adjacent PCB connections.

In some embodiment, forming the electronic connections between the PCB connections and the one or more integrated circuits includes dispensing a conductive material onto the top surface of the dielectric surfaces. In one or more embodiments, the dielectric surfaces include a dielectric constant that matches the dielectric constant of one or more integrated circuits, the PCB connections, and/or the conductive material. For example, the dielectric surface may include a dielectric constant of 3.41 when measured at 25 degrees Celsius and 1 MHz. By matching the dielectric constant of the dielectric surfaces, the one or more integrated circuits, the PCB connections, and/or the conductive material, the system may reduce power loss and noise. In various embodiments, dispensing the conductive material onto the dielectric surfaces increases the resilience of the bonded integrated circuit to stress when in use.

In some embodiments, the dielectric surfaces and the conductive material connections are sequentially dispensed and milled to connect a system with stacked integrated circuits. In particular embodiments, the additive manufacturing technique lends itself to increasing the production time of stacked integrated circuits while sharing the other benefits discussed herein.

According to a first aspect, a method comprising: A) dispensing a dielectric material on a first side of an integrated circuit; B) shaping the dielectric material on the first side of the integrated circuit to form a first dielectric surface; and C) dispensing a conductive material between a first printed circuit board (PCB) top surface and a top surface of the integrated circuit to form a first connection, the first connection situated on the first dielectric surface.

According to a further aspect, the method of the first aspect or any other aspect, further comprising: A) dispensing the dielectric material on a second side of the integrated circuit; B) shaping the dielectric material on the second side of the integrated circuit to form a second dielectric surface; and C) dispensing the conductive material between a second PCB top surface and the top surface of the integrated circuit to form a second connection, the second connection situated on the second dielectric surface.

According to a further aspect, the method of the first aspect or any other aspect, wherein dispensing the dielectric material on the first side of the integrated circuit further comprises situating the integrated circuit on a packaging substrate, the packaging substrate comprising a metal substrate, a ceramic substrate, a composite substrate, a polymer substrate, a hydrocarbon substrate, or any one combination thereof.

According to a further aspect, the method of the first aspect or any other aspect, wherein dispensing the dielectric material further comprises positioning a dispensing nozzle a first distance from the packaging substrate and a second distance from the integrated circuit, the first distance measuring 0.5 mm from the packaging substrate and the second distance measuring 0.25 mm from the integrated circuit, wherein the dispensing nozzle having a diameter of 0.05 mm-0.25 mm and wherein the dispensing nozzle dispenses the dielectric material at a dispensing pressure of 5-10 psi.

According to a further aspect, the method of the first aspect or any other aspect, further comprising removing a layer from the first connection by subtracting a portion of the conductive material, the portion equating to a depth of 0.005 to 0.065 millimeters.

According to a further aspect, the method of the first aspect or any other aspect, wherein the integrated circuit comprises a monolithic microwave integrated circuit with an integrated coplanar waveguide structure, the integrated coplanar waveguide structure extending across the top surface of the integrated circuit and comprises a first ground conductor and a second ground conductor separated by a microstrip conductor.

According to a further aspect, the method of the first aspect or any other aspect, wherein dispensing the conductive material to form the first connection further comprises: A) dispensing a first sub-connection between the first PCB top surface and the first ground conductor; B) dispensing a second sub-connection between the first PCB top surface and second ground conductor; and C) dispensing a third sub-connection between the first PCB top surface and the microstrip conductor.

According to a further aspect, the method of the first aspect or any other aspect, wherein shaping the dielectric material further comprises milling the first dielectric surface to extend from the packaging substrate to the top surface of the integrated circuit at an angle in the range of 15 degrees to 45 degrees relative to a substrate top surface of the packaging substrate.

According to a second aspect, a method comprising: A) dispensing a dielectric material on a first side of a first integrated circuit and in a gap between the first integrated circuit and a second integrated circuit; B) shaping the dielectric material on the first side of the first integrated circuit to form a first dielectric surface and in the gap in between the first integrated circuit and the second integrated circuit to form an inter-circuit dielectric surface; and C) dispensing a conductive material from a first PCB top surface to a first top surface of the first integrated circuit to form a first connection and from the first top surface to a second top surface of the second integrated circuit over the inter-circuit dielectric surface to form an inter-circuit connection.

According to a further aspect, the method of the second aspect or any other aspect, further comprising: A) dispensing the dielectric material on a second side of the second integrated circuit; B) shaping the dielectric material on the second side of the second integrated circuit to form a second dielectric surface; and C) dispensing the conductive material from a second PCB top surface to the second top surface of the second integrated circuit to form a second connection, the second connection situated on the second dielectric surface.

According to a further aspect, the method of the second aspect or any other aspect, further comprising removing a first layer from the first connection and second layer from the inter-circuit connection by subtracting a portion of the conductive material, the portion equating to a depth of 0.005 to 0.065 millimeters.

According to a further aspect, the method of the second aspect or any other aspect, further comprising situating the first integrated circuit and the second integrated circuit on a packaging substrate, the packaging substrate comprising a metal substrate, a ceramic substrate, a composite substrate, a polymer substrate, a hydrocarbon substrate, or any one combination thereof.

According to a further aspect, the method of the second aspect or any other aspect, wherein shaping the dielectric material further comprises: A) shaping the first dielectric surface to extend from the packaging substrate to the first top surface of the first integrated circuit at a first angle in the range of 15 degrees to 45 degrees relative to a substrate top surface of the packaging substrate; and B) shaping the inter-circuit dielectric surface to extend from the first top surface of the first integrated circuit to the second top surface of the second integrated surface at a second angle parallel to the substrate top surface of the packaging substrate.

According to a further aspect, the method of the second aspect or any other aspect, wherein dispensing the dielectric material further comprises positioning a dispensing nozzle a first distance from the packaging substrate and a second distance from the first integrated circuit, the first distance measuring 25 m from the packaging substrate and the second distance measuring 25 m from the first integrated circuit, wherein the dispensing nozzle having a diameter of 0.05 mm-0.25 mm and wherein the dispensing nozzle dispenses the dielectric material at a dispensing pressure of 5-10 psi.

According to a further aspect, the method of the second aspect or any other aspect, wherein the first integrated circuit comprises a first monolithic microwave integrated circuit with a first integrated coplanar waveguide structure and the second integrated circuit comprises a second monolithic microwave integrated circuit with a second integrated coplanar waveguide structure.

According to a further aspect, the method of the second aspect or any other aspect, wherein the first integrated coplanar waveguide structure extends across the first top surface of the first integrated circuit and comprises a first ground conductor and a second ground conductor separated by a first microstrip conductor.

According to a further aspect, the method of the second aspect or any other aspect, wherein the second integrated coplanar waveguide structure extends across the second top surface of the second integrated circuit and comprises a third ground conductor and a fourth ground conductor separated by a second microstrip conductor.

According to a further aspect, the method of the second aspect or any other aspect, wherein dispensing the conductive material to form the first connection, further comprises: A) dispensing a first sub-connection between the first PCB top surface and the first ground conductor; B) dispensing a second sub-connection between the first PCB top surface and the second ground conductor; and C) dispensing a third sub-connection between the first PCB top surface and the first microstrip conductor.

According to a further aspect, the method of the second aspect or any other aspect, wherein dispensing the conductive material to form the inter-circuit connection, further comprises: A) dispensing a fourth sub-connection between the first ground conductor and the third ground conductor; B) dispensing an fifth sub-connection between the second ground conductor and the fourth ground conductor; and C) dispensing a sixth sub-connection between the first microstrip conductor and the second microstrip conductor.

According to a third aspect, a system comprising: A) a packaging substrate; B) an integrated circuit situated on the packaging substrate; C) a first dielectric surface connected to a first side of the integrated circuit, the first dielectric surface extending from a substrate top surface of the packaging substrate to an integrated circuit top surface of the integrated surface; and D) a first connection extending from the substrate top surface of the packaging substrate to the integrated circuit top surface of the integrated circuit, the first connection situated on the first dielectric surface.

According to a further aspect, the method of the third aspect or any other aspect, wherein the conductive material comprises a silver ink, a copper ink, a nanoparticle ink, a carbon ink, a carbon-graphene ink, a conductive polymer, or any one combination thereof.

According to a further aspect, the method of the third aspect or any other aspect, wherein the packaging substrate further comprises a metal substrate, a ceramic substrate, a composite substrate, a polymer substrate, a hydrocarbon substrate, or any one combination thereof.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
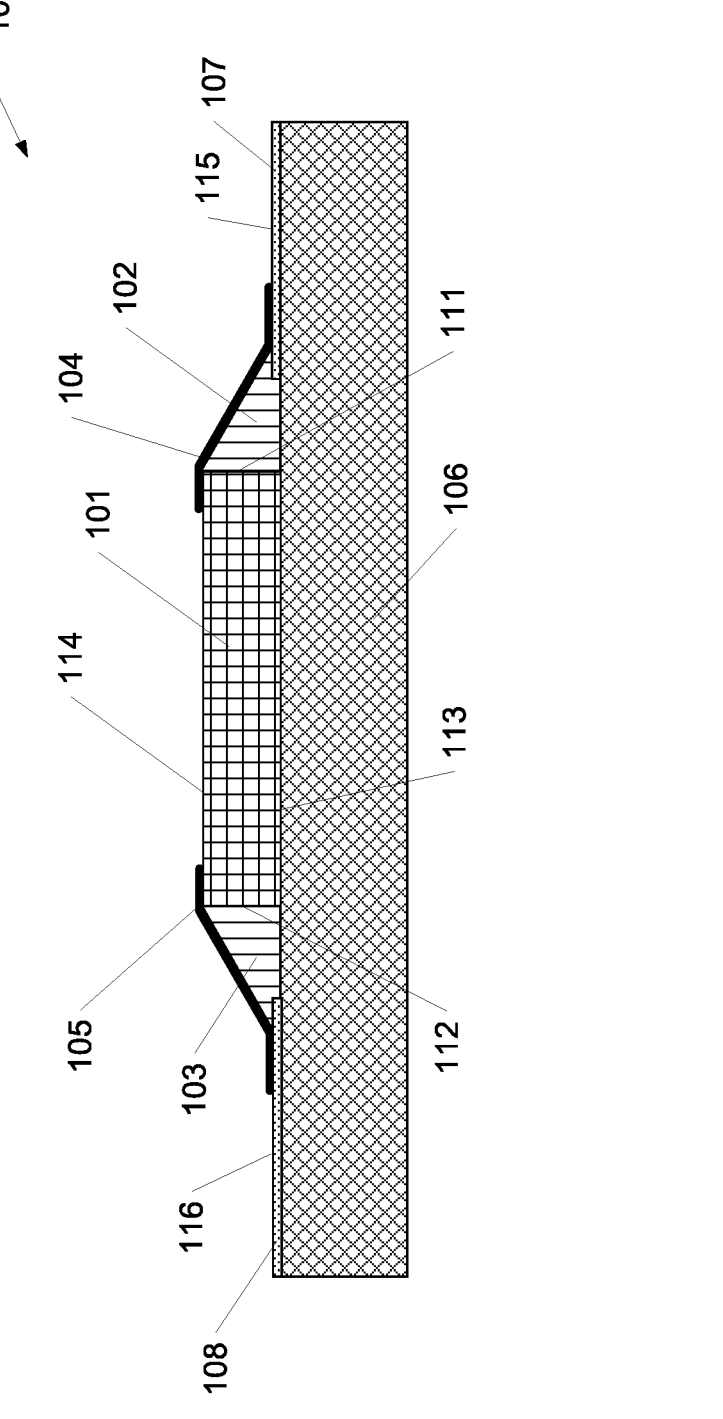
FIG. 1 illustrates a side view of a bonded integrated circuit, according to one embodiment of the present disclosure.

Prior to a detailed description of the disclosure, the following definitions are provided as an aid to understanding the subject matter and terminology of aspects of the present systems and methods, are exemplary, and not necessarily limiting of the aspects of the systems and methods, which are expressed in the claims. Whether or not a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended.

However, the capitalization or lack thereof within the remainder of this document is not intended to be necessarily limiting unless the context clearly indicates that such limitation is intended.

Overview

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to systems and methods for manufacturing a bonded integrated circuit. In various embodiments, forming the bonded integrated circuit includes adding dielectric material between at least one integrated circuit, a packaging substrate, and a series of PCB connections. In at least one embodiment, the integrated circuit electronically connects to various PCB connections, other integrated circuits, and/or any particular electronic infrastructure. The bonded integrated circuit may employ conductive material connections to connect the integrated circuit to the various components of the bonded integrated circuit. In particular embodiments, using dielectric surfaces and placing the conductive material connections on or within the dielectric material reduces power loss, noise, increases the resilience of the system when exposed to physical stress, and drastically increases the manufacturability of devices.

In certain embodiments, forming the bonded integrated circuit includes dispensing dielectric material at both sides of the integrated circuit. In a single integrated circuit configuration, the bonded integrated circuit may include dielectric surfaces at one or more sides of the integrated circuit. In at least one embodiment, the dielectric surfaces are milled to form ramp-like structures to support two or more conductive material connections between one or more integrated circuits and one or more PCB connections. In certain embodiments, a two or more integrated circuit configuration includes various dielectric surfaces that are dispensed and milled to connect each integrated circuit together. In some embodiments, the dielectric surfaces between the two or more integrated circuits are parallel to the top surface of each integrated circuit. In the two or more integrated circuit configuration, the bonded integrated circuit may include dielectric surfaces with ramp-like configurations between the integrated circuits and their adjacent PCB connections.

In some embodiment, forming the electronic connections between the PCB connections and the one or more integrated circuits includes dispensing a conductive material onto the top surface of the dielectric surfaces. In one or more embodiments, the dielectric surfaces include a dielectric constant that matches the dielectric constant of one or more integrated circuits, the PCB connections, and/or the conductive material. For example, the dielectric surface may include a dielectric constant of 3.41 when measured at 25 degrees Celsius and 1 MHz. By matching the dielectric constant of the dielectric surfaces, the one or more integrated circuits, the PCB connections, and/or the conductive material, the system may reduce power loss and noise. In various embodiments, dispensing the conductive material onto the dielectric surfaces increases the resilience of the bonded integrated circuit to stress when in use.

In some embodiments, the dielectric surfaces and the conductive material connections are sequentially dispensed and milled to connect a system with stacked integrated circuits. In particular embodiments, the additive manufacturing technique lends itself to increasing the production time of stacked integrated circuits while sharing the other benefits discussed herein.

Exemplary Embodiments

Referring now to the figures, for the purposes of example and explanation of the fundamental processes and components of the disclosed systems, reference is made to FIG. 1, which illustrates a bonded integrated circuit 100, according to one or more embodiments. As will be understood and appreciated, the bonded integrated circuit 100 shown in FIG. 1 represents merely one approach or embodiment of the present system, and other aspects are used according to various embodiments of the present system.

In some embodiments, the bonded integrated circuit 100 may include but is not limited to an integrated circuit 101, a packaging substrate 106, a first printed circuit board (PCB) 107, and a second printed circuit board (PCB) 108. In certain embodiments, the bonded integrated circuit 100 includes the integrated circuit 101 bonded and/or connected to the packaging substrate 106, the first PCB 107, and the second PCB 108. In particular embodiments, the integrated circuit 101 bonds to the packaging substrate 106 and the first PCB 107 through a first dielectric surface 102. In at least one embodiment, the integrated circuit 101 bonds to packaging substrate 106 and the second PCB 108 through a second dielectric surface 103.

To form an electrical connection between the first PCB 107, the integrated circuit 101, and the second PCB 108, the bonded integrated circuit 100 may include a first connection 104 and a second connection 105. The first connection 104 and the second connection 105 may include a conductive material used to electronically connect the first PCB 107, the integrated circuit 101, and the second PCB 108. Forming the first connection 104 and the second connection 105 may include dispending the conductive material onto the first dielectric surface 102 and the second dielectric surface 103. For example, the first connection 104 can form an electrical connection between the first PCB 107 and the integrated circuit 101. Continuing this example, the second connection 105 can form an electrical connection between the second PCB 108 and the integrated circuit 101. In particular embodiments, the first connection 104 and the second connection 105 can be manufactured from the conductive materials. Nonlimiting examples of the conductive material may include a silver ink, a silver nanoparticle ink, a copper ink, a nanoparticle ink, a carbon ink, a carbon-graphene ink, a conductive polymer, or a combination thereof.

The bonded integrated circuit 100 may apply to any integrated circuit 101 appended to a printed circuit board (PCB) or packaging substrate 106 used for electronic systems. The integrated circuit 101 may connect to the first PCB 107 and the second PCB 108 through the first connection 104 and the second connection 105. In an exemplary use case scenario, the first connection 104 and the second connection 105 can transmit a signal from the first PCB 107 to the second PCB 108 through the integrated circuit 101. The first connection 104 and the second connection 105 may unintentionally propagate a signal when performing a particular action. Producing an unintended signal may introduce noise into the system, which may cause unintended negative consequences. As discussed in further detail herein, the first dielectric surface 102 and the second dielectric surface 103 may have similar dielectric constants as compared to the integrated circuit 101, the packaging substrate 106, the first PCB 107, and the second PCB 108. By matching the dielectric constant between the first dielectric surface 102, the second dielectric surface 103, the integrated circuit 101, the packaging substrate 106, the first PCB 107, the second PCB 108, the first connection 104, the second connection 105, or a combination thereof, the noise produced by the first connection 104 and the second connection 105 may be reduced. For example, the shape, the relative volume, the length, and/or any other particular parameter of the first dielectric surface 102 and the second dielectric surface 103 may help reduce the noise and energy losses associated with the functionality of the first connection 104 and the second connection 105.

The integrated circuit 101 can be any semiconductor-based circuit incorporated into an electronic system. For example, the integrated circuit 101 can include but is not limited to a monolithic microwave integrated circuit with a coplanar waveguide structure (CPW), mixed integrated circuits, radio frequency integrated circuits, and microwave integrated circuits. In one or more embodiments, the integrated circuit 101 can bond to the packaging substrate 106 using die bonding, flip-chip bonding, die attach films, epoxy materials, the first dielectric surface 102 and the second dielectric surface 103, any particular integrated circuit bonding technique, or a combination thereof. For example, the integrated circuit 101 may bond to the packaging substrate 106 using a heat-treated epoxy resin. Continuing this example, a dielectric material used to form the first dielectric surface 102 and the second dielectric surface 103 may be applied to the integrated circuit 101 after the integrated circuit 101 is bonded to the packaging substrate 106. Applying the dielectric material may reinforce the bond between the integrated circuit 101 and the packaging substrate 106. In another example, the dielectric material of the first dielectric surface 102 and the second dielectric surface 103 may function as a bonding mechanism for attaching the integrated circuit 101 to the packaging substrate 106.

In one or more embodiments, the packaging substrate 106 can be any particular material configured to support and/or house the integrated circuit 101. In some embodiments, the packaging substrate 106 includes but is not limited to a metal substrate, a ceramic substrate, a composite substrate, a polymer substrate, a hydrocarbon substrate, any particular packaging material, or a combination thereof. In at least one embodiment, the packaging substrate 106 functions as a surface to attach the integrated circuit 101 to the first PCB 107 and the second PCB 108. In certain embodiments, the packaging substrate 106 can encapsulate the integrated circuit 101 to protect the integrated circuit 101 from physical damage and corrosion.

The first dielectric surface 102 and the second dielectric surface 103 may function as a support for the first connection 104 and the second connection 105, respectively. In particular embodiments, the first dielectric surface 102 and the second dielectric surface 103 can be manufactured from any dielectric material that matches a dielectric constant of the first connection 104, the second connection 105, the packaging substrate 106, the first PCB 107, and/or the second PCB 108. In certain embodiments, the first dielectric surface 102 and the second dielectric surface 103 can include a UV-curable material, an epoxy material, a silicone material, a urethane material, or a combination thereof. In various embodiments, the first dielectric surface 102 and the second dielectric surface 103 are substantially similar. For example, the first dielectric surface 102 and the second dielectric surface 103 share substantially similar dielectric materials and shapes. In some embodiments, the first dielectric surface 102 and the second dielectric surface 103 are distinct in composition, shape, arrangement, or combinations thereof. For example, the first dielectric surface 102 may include a ramp-like configuration, while the dielectric surface 103 has a semi-circular configuration. In another example, the first dielectric surface 102 may include a longer ramp configuration as compared to the second dielectric surface 103.

The first dielectric surface 102 and the second dielectric surface 103 may include two distinct dielectric materials. For example, the first dielectric surface 102 may include a first dielectric material with a first dielectric constant, and the second dielectric surface 103 may include a second dielectric material with a second dielectric constant. The respective dielectric constants of the first dielectric surface 102 and the second dielectric surface 103 may be affected by the ambient temperature of the bonded integrated circuit 100, the thickness of the dielectric surfaces, the ambient moisture of the bonded integrated circuit 100, and the frequency of the signal passing through the bonded integrated circuit 100. In certain embodiments, the first dielectric surface 102 and the second dielectric surface 103 may include a composite dielectric material. The composite dielectric material may include a mixed compound used based on its particular dielectric constant.

In certain embodiments, the dielectric material used for the first dielectric surface 102 and the second dielectric surface 103 can have similar dielectric constants measuring at least 2.0, 2.0-5.0, 2.0-3.0, 3.0-3.41, 3.41, 3.41-4.0 4.0-5.0, or less than 5.0 when measured at 1 MHz and 25 degrees Celsius. The dielectric material of the first dielectric surface 102 and the second dielectric surface 103 may include equivalent dissipation factors of at least 0.01, 0.01-0.06, 0.01-0.02, 0.02-0.03, 0.03, 0.03-0.04, 0.04-0.05, 0.05-0.06, or less than 0.06 when measured at 1 MHz. In one or more embodiments, the first dielectric surface 102 and the second dielectric surface 103 can solidify with a UV light. For example, once placed onto the packaging substrate 106, the dielectric material of the first dielectric surface 102 and the second dielectric surface 103 is exposed to the UV light to solidify in less than 5 seconds.

In certain embodiments, the first dielectric surface 102 and the second dielectric surface 103 are dispensed at a first side 111 and a second side 112 of the integrated circuit 101, respectively. For example, the first dielectric surface 102 may be dispensed to make contact with a substrate top surface 113 of the packaging substrate 106 and the first side 111 of the integrated circuit 101. Continuing this example, the second dielectric surface 103 may be dispensed to make contact with the substrate top surface 113 of the packaging substrate 106 and the second side 112 of the integrated circuit 101. In various embodiments, the first dielectric surface 102 and the second dielectric surface 103 are partially dispensed on a circuit top surface 114. For example, the first dielectric surface 102 and the second dielectric surface 103 are initially dispensed on the substrate top surface 113 and partially dispensed on the circuit top surface 114. Continuing this example, the dielectric material of the first dielectric surface 102 and the second dielectric surface 103 located on the circuit top surface 114 are removed to form a substantially flat surface.

In certain embodiments, the first PCB 107 and the second PCB 108 are bonded to the packaging substrate 106. For example, the first PCB 107 and the second PCB 108 are bonded to the packaging substrate 106 using an adhesive, an epoxy, and/or any pertinent bonding technique. In some embodiments, the first PCB 107 and the second PCB 108 include ring resonators, coplanar waveguides, or a combination thereof. In various embodiments, the first PCB 107 and the second PCB 108 are integrated into the packaging substrate 106. For example, the first PCB 107 and the second PCB 108 can be incorporated into the substrate top surface 113 of the packaging substrate 106. In at least one embodiment, the first PCB 107 and the second PCB 108 may form one continuous PCB to support the integrated circuit 101. For example, the first PCB 107 and the second PCB 108 can form a continuous PCB. Continuing this example, the integrated circuit 101 can append to and form a connection with the continuous PCB.

In one or more embodiments, the first connection 104 can form an electrical connection between the first PCB 107 and the integrated circuit 101. In various embodiments, the second connection 105 can form an electrical connection between the second PCB 108 and the integrated circuit 101. In particular embodiments, the first connection 104 and the second connection 105 can be manufactured from conductive materials. Nonlimiting examples of the conductive material may include a silver ink, a silver nanoparticle ink, a copper ink, a nanoparticle ink, a carbon ink, a carbon-graphene ink, a conductive polymer, any particular conductive material, or a combination thereof. In various embodiments, the first connection 104 can extend from a first PCB top surface 115 to the circuit top surface 114. In some embodiments, the second connection 105 can extend from a second PCB top surface 116 to the circuit top surface 114. The first dielectric surface 102 and the second dielectric surface 103 may support the first connection 104 and the second connection 105, respectively. In particular embodiments, by matching the dielectric constant between the first dielectric surface 102, the second dielectric surface 103, the first connection 104, the second connection 105, the first PCB 107, and the second PCB 108, the first dielectric surface 102 and the second dielectric surface 103 reduce the noise present in the first connection 104 and the second connection 105.

TABLE 1

Various technical metrics for disclosed embodiments of the bonded integrated circuit as compared to traditional wire-bonded integrated circuits.

| | Wire-bonded integrated circuit with ring resonator | AM bonded integrated circuit 100 with ring resonator | Wire-bonded integrated circuit with CPW | AM bonded integrated circuit 100 with CPW |
|---|---|---|---|---|
| Mean S21 @ Fc. (dB) | −14.820 | −14.866 | −0.395 | −0.456 |
| Std Dev. S21 (dB) | 0.130 | 1.035 | 0.012 | 0.018 |
| Center Frequency (GHz) | 5.700 | 5.641 | 5.700 | 5.641 |
| Average Bandwidth (GHz) | 0.123 | 0.152 | 10.000 | 10.000 |

TABLE 1-continued

| | Wire-bonded integrated circuit with ring resonator | AM bonded integrated circuit 100 with ring resonator | Wire-bonded integrated circuit with CPW | AM bonded integrated circuit 100 with CPW |
|---|---|---|---|---|
| Average Phase Delay (degrees) | N/A | N/A | −151.9 | −157.0 |
| Average Insertion Loss (dB/cm) | N/A | N/A | 0.156 | 0.180 |

Various technical metrics for disclosed embodiments of the bonded integrated circuit as compared to traditional wire-bonded integrated circuits.

In some embodiments, the bonded integrated circuit 100 provides technical improvements and/or similarities as compared to common wire-bonded integrated circuits and/or any equivalent bonding techniques. As illustrated in table 1 and in multiple embodiments, various metrics are demonstrated, showing technical similarities and/or improvements of the bonded integrated circuit 100 as compared to traditional wire-bonded integrated circuits. For example, the wire-bonded integrated circuit and the bonded integrated circuit 100 illustrate similar s-parameters (e.g., S21).

Figure 2:
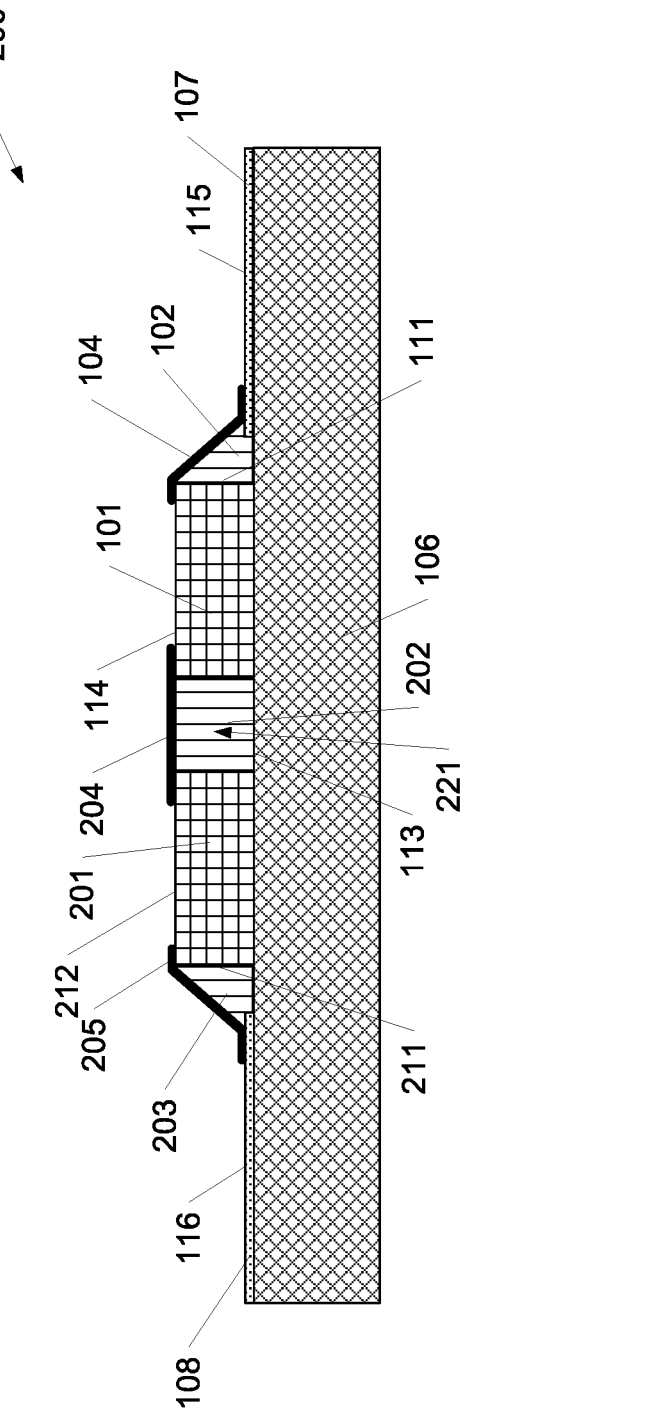
FIG. 2 illustrates a side view of a double bonded integrated circuit, according to one embodiment of the present disclosure.

Referring now to FIG. 2, illustrated is a side view of a double bonded integrated circuit 200, according to one embodiment of the present disclosure. In particular embodiments, the double bonded integrated circuit 200 is substantially similar to the bonded integrated circuit 100 with two integrated circuits. In various embodiments, the double bonded integrated circuit 200 includes the integrated circuit 101 and a second integrated circuit 201. In some embodiments, the second integrated circuit 201 is substantially similar to the integrated circuit 101. In certain embodiments, the integrated circuit 101 and the second integrated circuit 201 are bonded to the packaging substrate 106 through the first dielectric surface 102 and a second dielectric surface 203. The integrated circuit 101 and the second integrated circuit 201 may bond to the packaging substrate through any bonding technique shown and/or discussed herein.

In one or more embodiments, the integrated circuit 101 and the second integrated circuit 201 are connected to the first PCB 107 and the second PCB 108 through the first connection 104, an inter-circuit connection 204, and a second connection 205. In some embodiments, the first dielectric surface 102 may support the first connection 104. In particular embodiments, the first connection 104 extends from the first PCB top surface 115 to the circuit top surface 114. In various embodiments, the first connection 104 connects the first PCB 107 to the integrated circuit 101. In one or more embodiments, the integrated circuit 101 and the second integrated circuit 201 are connected through the inter-circuit connection 204. In at least one embodiment, the inter-circuit connection 204 is situated on an inter-circuit dielectric surface 202. In various embodiments, the inter-circuit dielectric surface 202 is situated in a gap 221 in between the integrated circuit 101 and the second integrated circuit 201. In particular embodiments, the inter-circuit dielectric surface 202 is substantially similar to the first dielectric surface 102, the second dielectric surface 103, and/or any particular dielectric surface of the double bonded integrated circuit 200. In some embodiments, the inter-circuit dielectric surface 202 and the inter-circuit connection 204 share similar dielectric constants. In some embodiments, the inter-circuit connection 204 extends from the circuit top surface 114 to a second circuit top surface 212. The inter-circuit connection 204 may electrically connect the integrated circuit 101 to the second integrated circuit 201. In various embodiments, the second integrated circuit 201 may connect to the second PCB 108 through the second connection 205. In particular embodiments, the second connection 205 is situated on the second dielectric surface 203. In one or more embodiments, the second connection 205 extends from the second PCB top surface 116 to the second circuit top surface 212. The second connection 205 may connect the second integrated circuit 201 to the second PCB 108. In some embodiments, the second dielectric surface 203 is substantially similar to the second dielectric surface 103. In various embodiments, the second dielectric surface 203 is positioned on the substrate top surface 113 and at a second side 211. The inter-circuit dielectric surface 202 may be formed to have a flush surface with the integrated circuit 101 and the second integrated circuit 201. In at least one embodiment, the inter-circuit dielectric surface 202 is parallel with the substrate top surface 113.

Figure 3:
FIG. 3 illustrates a perspective view of a first connection of the bonded integrated circuit, according to one embodiment of the present disclosure.

Referring now to FIG. 3, illustrated is a perspective view of the first connection 104 of the bonded integrated circuit 100, according to one embodiment of the present disclosure. In at least one embodiment, the first connection 104 can include a first sub-connection 301, a second sub-connection 302, and a third sub-connection 303. The first sub-connection 301, the second sub-connection 302, and the third sub-connection 303 may interface with a first PCB ground connection 311, a second PCB microstrip connection 312, and a second PCB microstrip connection 312 of the first PCB 107, respectively. In some embodiments, the first connection 104 extends across the first dielectric surface 102. The first connection 104 can electrically connect the first PCB ground connection 311 to a first circuit ground connection 321 through the first sub-connection 301. The first connection 104 can electrically connect the second PCB microstrip connection 312 to a circuit microstrip connection 322 through the second sub-connection 302. The first connection 104 can electrically connect the second PCB ground connection 313 to a second circuit ground connection 323 through the third sub-connection 303. In certain embodiments, the first PCB ground connection 311, the second PCB microstrip connection 312, and the second PCB ground connection 313 form a coplanar waveguide structure. In at least one embodiment, the first circuit ground connection 321, the circuit microstrip connection 322, and the second circuit ground connection 323 form a coplanar waveguide structure. In certain embodiments, the second connection 105 (not pictured) may form a substantially similar connection between the second PCB 108 and the integrated circuit 101 as compared to the first connection 104.

The first connection 104 and the second connection 105 may form one or more start or stop points 331. The one or more start or stop points 331 may be defined as manufacturing defects produced when dispensing the conductive material. For example, The start and stop points 331 are produced by an ink dispensing system when forming the first connection 104 and the second connection 105. In at least one embodiment, the start and stop points 331 may be removed to shape the first connection 104 and the second connection 105 into repeatable and consistent geometrical shapes.

Figure 4:
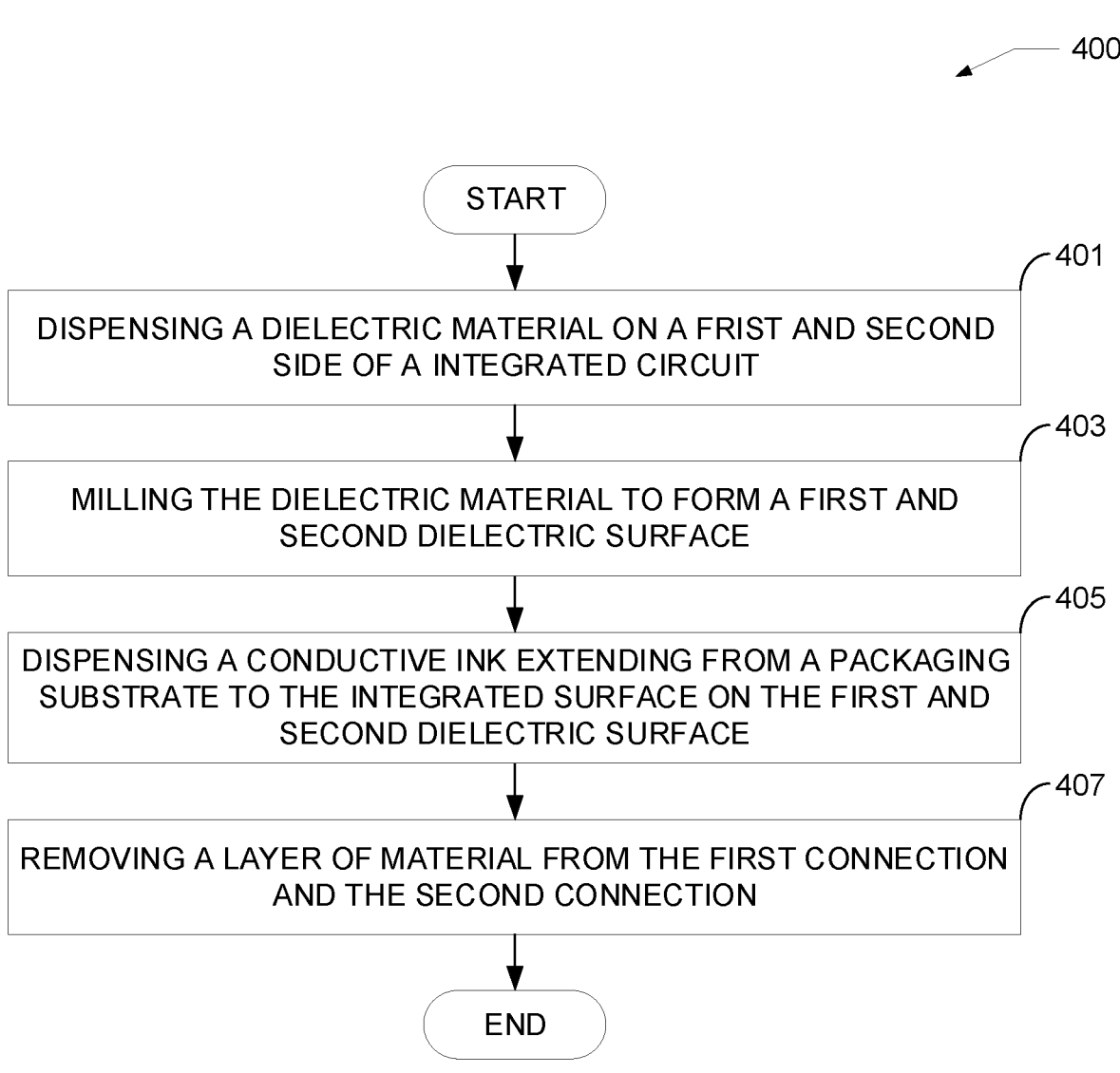
FIG. 4 illustrates a flowchart of a process, according to one embodiment of the present disclosure.

Referring now to FIG. 4, illustrated is a flowchart of a process 400, according to one embodiment of the present disclosure. In at least one embodiment, the flowchart of the process 400 illustrates a procedure for forming the bonded integrated circuit 100, shown in FIG. 1 and described herein. In particular embodiments, the process 400 may include various boxes that can be performed in any particular order than can be appreciated herein. In certain embodiments, the process 400 can be completed by performing one or more of the boxes 401, 403, 405, and 407. In some embodiments, the process 400 can be applied to the manufacturing process of a bonded integrated circuit with one dielectric surface and one connection (e.g., the first dielectric surface 102 and the first connection 104). For example, the process 400 may define the process for forming a single dielectric surface and a single connection between a PCB and a single pin of a microprocessor.

At box 401, the process 400 may include dispensing the dielectric material on the first side 111 of the integrated circuit 101 and the second side 112 of the integrated circuit 101. In at least one embodiment, dispensing techniques include but are not limited to microdispensing and dam and fill techniques. In various embodiments, a dispensing mechanism dispenses dielectric material on the first side 111 of the integrated circuit 101 and the substrate top surface 113. For example, a dispensing nozzle may release the dielectric material onto the substrate top surface 113 and continue to dispense the dielectric material until it makes contact with the first side 111 of the integrated circuit 101. Continuing this example, a surface tension between the dispensed dielectric material, the substrate top surface 113, and/or the integrated circuit 101 may enable a flow of dielectric material from the substrate top surface 113 to the integrated circuit 101. Dispensing the dielectric material on the second side 112 of the integrated circuit 101 may include a substantially similar procedure as dispensing the dielectric material on the first side 111 of the integrated circuit 101.

The dielectric material may be dispensed by positioning the dispensing nozzle a first distance from the packaging substrate 106 and a second distance from the integrated circuit 101. For example, the first distance from the dispensing nozzle to the packaging substrate 106 may measure at least 10 μm, 10-100 μm, 10-50 μm, 50-70 μm, 70-90 μm, 90-100 μm, or less than 100 μm. In another example, the second distance from the dispensing nozzle to the integrated circuit 101 may measure at least 10 μm, 10-100 μm, 10-50 μm, 50-70 μm, 70-90 μm, 90-100 μm, or less than 100 μm. The dispensing mechanism may include but is not limited to a syringe pump, a volumetric pump, a progressive cavity pump, a positive displacement pump, and/or an infusion pump.

In some embodiments, the dispensing mechanism can adjust the volume flow rate, the pressure, the angle of the dispensing nozzle relative to the packaging substrate 106, and the opening of the dispensing nozzle to control the amount of the dielectric material dispensed onto the packaging substrate 106, the first PCB 107, the second PCB 108, the integrated circuit 101, and/or any particular surface associated with the bonded integrated circuit 100. In some embodiments, varying the volume of dielectric material dispensed, the pressure of the dispensing mechanism when dispensing, the angle of the dispensing nozzle relative to the packaging substrate 106, and the opening of the dispensing nozzle can affect the initial form of the first dielectric surface 102 and the second dielectric surface 103. For example, varying the angle of the dispensing nozzle relative to the integrated circuit 101, the packaging substrate 106, the first PCB 107, and/or the second PCB 108 may allow a flow of dielectric material from the initial dispensing location (e.g., substrate top surface 113) to the final dispensing location (e.g., circuit top surface 114).

In particular embodiments, the dielectric material may be dispensed in a particular fashion based on the application of the bonded integrated circuit 100. For example, the dielectric material may be applied to create a relatively long first dielectric surface 102 and second dielectric surface 103 for radio frequency applications. In at least one embodiment, the dispensing mechanism may dispense more than 100% of the required dielectric material. For example, the dispensing mechanism may dispense 20% more dielectric material than necessary for eventual removal to form the first dielectric surface 102 and the second dielectric surface 103. In various embodiments, the dispensing mechanism may dispense 20% of the dielectric material to form the first dielectric surface 102 and the second dielectric surface 103. In some embodiments, dispensing the dielectric material varies by adjusting a surface tension between the dielectric material, the packaging substrate 106, the integrated circuit 101, the first PCB 107, and the second PCB 108. For example, the material of the packaging substrate 106 and the integrated circuit 101 may affect the surface tension of the dielectric material to increase the length of the first dielectric surface 102 and the second dielectric surface 103. In at least one embodiment, the dispensing mechanism may vary particular conditions (e.g., volume, pressure, dispensing time, exposure time) to manage the distribution of the dielectric material on the integrated circuit 101 and the packaging substrate 106. In at least one embodiment, the dispensing mechanism may guide the dispensed dielectric material by building an initial dam that directs the flow of the dielectric material. For example, the dispensing mechanism may deposit an initial outline (e.g., dam) of the first dielectric surface 102 and the second dielectric surface 103 on the substrate top surface 113. Continuing this example, the dispensing mechanism may fill the initial outline of the first dielectric surface 102 and the second dielectric surface 103 with the dielectric material to form the initial dielectric material for the first dielectric surface 102 and the second dielectric surface 103.

In certain embodiments, the dielectric material may solidify by applying the UV light to the dispensed dielectric material. For example, the dielectric material may be exposed to the UV light for less than 5 seconds to form a solid compound. When solidified, the dielectric material may sustain a bond between the integrated circuit 101, the packaging substrate 106, the first PCB 107, and/or the second PCB 108.

At box 403, the process 400 may include milling the dielectric material on the first side 111 of the integrated circuit 101 to form the first dielectric surface 102 and the second side 112 of the integrated circuit 101 to form the second dielectric surface 103. In particular embodiments, the milling process may include removing excess dielectric material to form the first dielectric surface 102 and the second dielectric surface 103. For example, the initial deposition of the dielectric material may be shaped similarly to a dome. Continuing this example, any particular microfabrication milling system may remove the excess dielectric material to form the first dielectric surface 102 and the second dielectric surface 103 into ramps. In at least one embodiment, the ramped shape of the first dielectric surface 102 and the second dielectric surface 103 may include an angle relative to the substrate top surface 113 that measures at least 15 degrees, 15-45 degrees, 15-30 degrees, 30-45 degrees, and less than 45 degrees. In particular embodiments, the first dielectric surface 102 and the second dielectric surface 103 may have varying changes in the angle relative to the substrate top surface 113. For example, the angle may begin at 15 degrees and change to 30 degrees. In some embodiments, the microfabrication milling system may remove varying amounts of dielectric material to form distinct types of dielectric surfaces (e.g., first dielectric surface 102, second dielectric surface 103) depending on the application of the bonded integrated circuit 100. For example, the microfabrication milling system may remove dielectric material at varying tapers to produce the first dielectric surface 102 and the second dielectric surface 103 with varying angles relative to the substrate top surface 113.

At box 405, the process 400 may include dispensing the conductive material from the first PCB 107 to the circuit top surface 114 of the integrated circuit 101 to form the first connection 104 and from the second PCB 108 to the circuit top surface 114 of the integrated circuit 101 to form the second connection 105. In some embodiments, the first connection 104 and the second connection 105 are situated on the first dielectric surface 102 and the second dielectric surface 103, respectively. For example, the first connection 104 may be dispensed from the first PCB top surface 115 to the circuit top surface 114 and rest on the first dielectric surface 102. In another example, the second connection 105 may be dispensed from the second PCB top surface 116 to the circuit top surface 114 and rest on the second dielectric surface 103. In at least one embodiment, the conductive material is dispensed using the ink dispensing system. In various embodiments, the ink dispensing system may use one or more computer vision techniques, algorithms, or combinations thereof to automatically locate the first dielectric surface 102 and/or the second dielectric surface 103. In one or more embodiments, the ink dispensing system may use one or more computer vision techniques, algorithms, or combinations thereof to automatically locate the first dielectric surface 102 and/or the second dielectric surface 103 to dispense the first connection 104 and the second connection 105.

In certain embodiments, the first connection 104 and the second connection 105 are dispensed as three sub-connections (e.g., the first sub-connection 301, the second sub-connection 302, and the third sub-connection 303 as shown in FIG. 3 and described herein). For example, the ink dispensing system may dispense the first sub-connection 301 by continuously releasing conductive material from the first PCB ground connection 311 to the first circuit ground connection 321. In some embodiments, the process may be repeated for each sub-connection of the first connection 104 and the second connection 105. In at least one embodiment, the first connection 104 and the second connection 105 can include any particular number of sub-connections depending on the application of the bonded integrated circuit 100.

In certain embodiments, the ink dispensing system dispenses the conductive material onto the first dielectric surface 102 and the second dielectric surface 103 to form the first connection 104 and the second connection 105. In some embodiments, the first dielectric surface 102 and the second dielectric surface 103 may share similar dielectric constants to the first connection 104 and the second connection 105. In at least one embodiment, matching the dielectric constant between the first connection 104, the second connection 105, the first dielectric surface 102, and the second dielectric surface 103 reduces the amount of noise produced by the first connection 104 and the second connection 105 during use.

At box 407, the process 400 may include removing a first layer and a second layer of conductive material from the first connection 104 and the second connection 105, respectively. In particular embodiments, the first connection 104 and the second connection 105 can be processed to include substantially flat surfaces. For example, a micromachining tool may be employed to smoothen a first top surface of the first connection 104 and a second top surface of the second connection 105. In various embodiments, the micromachining tool can remove the first layer of conductive material and the second layer of conductive material to reduce the depth of the first connection 104 and the second connection 105 by 25 μm. For example, the micromachining tool may remove at least 5.0 μm, 5.0-65.0 μm, 5.0-10.0 μm, 5.0-25.0 μm, 10.0-15.0 μm, 15.0-20.0 μm, 20.0-25.0 μm, 25.0-30.0 μm, 30.0-65.0 μm, or less the 65.0 μm. In particular embodiments, when removing more than 5 μm of conductive material from the first connection 104 and/or the second connection 105, the micromachining tool removes the layer of conductive material in increments of 5.0 μm. In certain embodiments, the micromachining tool removes conductive material from the first connection 104 and the second connection 105 to reduce energy loss, form a uniform geometry for repeatable structures, and remove imperfections/errors such as the start and stop points 331. The micromachining tool may shape the first connection 104 and the second connection 105 to form tapered edges. In at least one embodiment, the tapered edges increase radio frequency performance. For example, the tapered edges may reduce noise caused by the first connection 104 and the second connection 105, reduced power loss, and increase the resiliency of the first connection 104 and the second connection 105 to vibrations.

Figure 5:
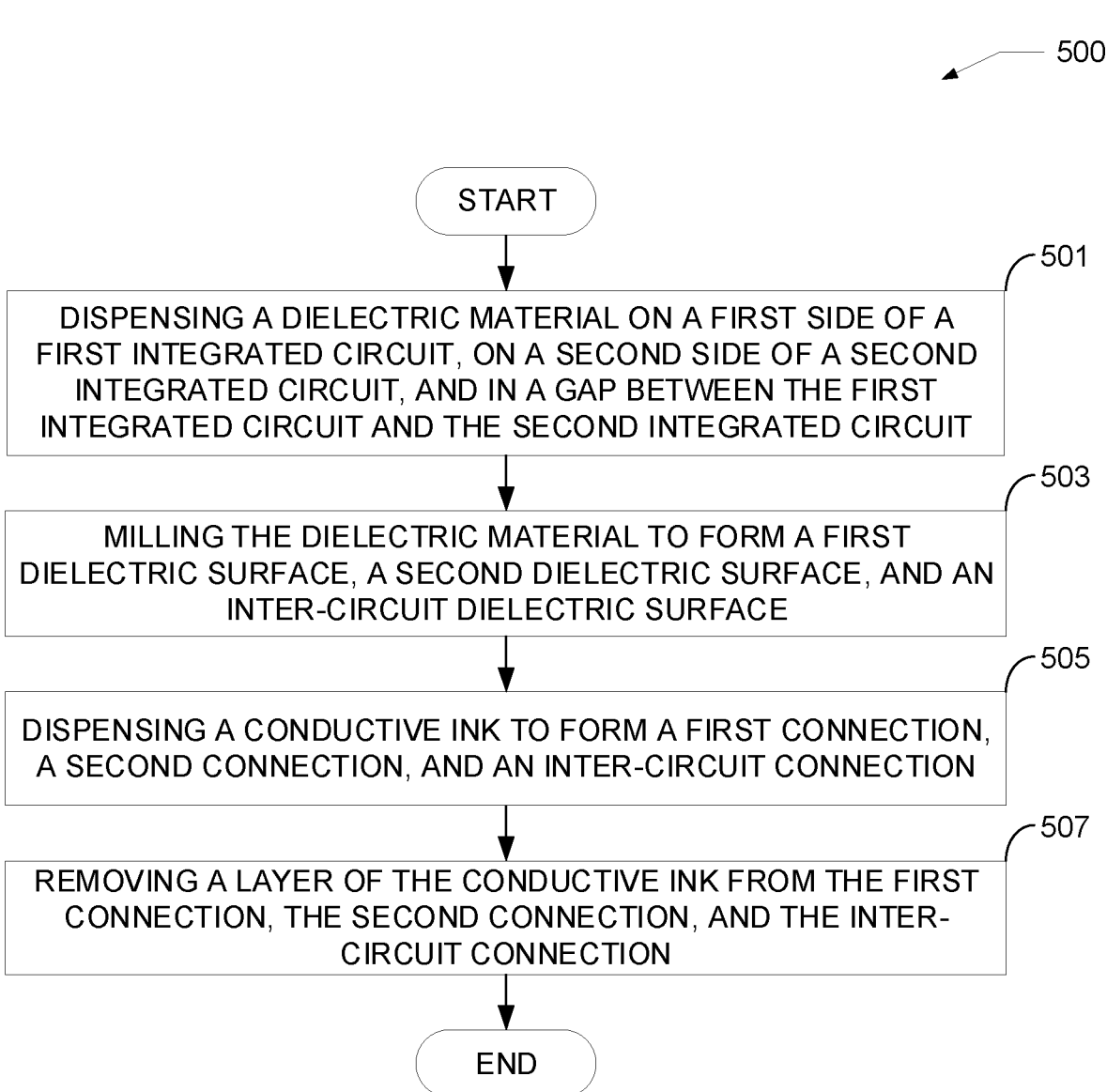
FIG. 5 illustrates a flowchart of a process, according to one embodiment of the present disclosure.

Referring now to FIG. 5, illustrated is a flowchart of the process 500, according to one embodiment of the present disclosure. In some embodiment, the process 500 illustrates a procedure for forming the double bonded integrated circuit 200, shown in FIG. 2 and described herein. The process 500 may be substantially similar to the process 400 for the double bonded integrated circuit 200. In various embodiments, the process 500 may include various boxes that can be performed in any particular order than can be appreciated herein. In certain embodiments, the process 500 can be completed by performing one or more of the boxes 501, 503, 505, and 507. In some embodiments, the process 500 can be applied to the manufacturing process of a bonded integrated circuit with one dielectric surface and one connection (e.g., the first dielectric surface 102 and the first connection 104). For example, the process 500 may define the process for forming a single dielectric surface and a single connection between a PCB and a single pin of a microprocessor.

At box 501, the process 500 may include dispensing the dielectric material on the first side 111 of the integrated circuit 101, on the second side 211 of the second integrated circuit 201, and in the gap 221 between the integrated circuit 101 and the second integrated circuit 201. In at least one embodiment, dispensing techniques include but are not limited to microdispensing and dam and fill techniques. In various embodiments, the dispensing mechanism dispenses the dielectric material on the first side 111 of the integrated circuit 101 and the substrate top surface 113. For example, a dispensing nozzle may release the dielectric material onto the substrate top surface 113 and continue to dispense the dielectric material until it makes contact with the first side 111 of the integrated circuit 101. Continuing this example, a surface tension between the dispensed dielectric material, the substrate top surface 113, and/or the integrated circuit 101 may facilitate a flow of dielectric material from the substrate top surface 113 to the integrated circuit 101. Dispensing the dielectric material on the second dielectric surface 203 of the second integrated circuit 201 and/or in the gap 221 may include a substantially similar procedure as dispensing the dielectric material on the first side 111 of the integrated circuit 101. In at least one embodiment, the dielectric material is dispensed in the gap 221 in between the integrated circuit 101 and the second integrated circuit 201.

The dielectric material may be dispensed by positioning the dispensing nozzle a first distance from the packaging substrate 106 and a second distance from the integrated circuit 101 and/or the second integrated circuit 201. For example, the first distance from the dispensing nozzle to the packaging substrate 106 may measure at least 10 μm, 10-100 μm, 10-50 μm, 50-70 μm, 70-90 μm, 90-100 μm, or less than 100 μm. In another example, the second distance from the dispensing nozzle to the integrated circuit 101 and/or the second integrated circuit 201 may measure at least 10 μm, 10-100 μm, 10-50 μm, 50-70 μm, 70-90 μm, 90-100 μm, or less than 100 μm. The dispensing mechanism may include but is not limited to a syringe pump, a volumetric pump, a progressive cavity pump, a positive displacement pump, and/or an infusion pump.

In some embodiments, the dispensing mechanism can adjust the volume, the pressure, the angle of the dispensing nozzle relative to the packaging substrate 106, and the opening of the dispensing nozzle to control the amount of the dielectric material dispensed onto the packaging substrate 106, the first PCB 107, the second PCB 108, the integrated circuit 101, the gap 221 between the integrated circuit 101 and the second integrated circuit 201, and/or any particular surface associated with the double bonded integrated circuit 200. In some embodiments, varying the volume of dielectric material dispensed, the pressure of the dispensing mechanism when dispensing, the angle of the dispensing nozzle relative to the packaging substrate 106, and the opening of the dispensing nozzle can affect the initial form of the first dielectric surface 102, the inter-circuit dielectric surface 202, and the second dielectric surface 203. For example, varying the angle of the dispensing nozzle relative to the integrated circuit 101, the packaging substrate 106, the first PCB 107, the second integrated circuit 201, and/or the second PCB 108 may allow a flow of dielectric material from the initial dispensing location (e.g., substrate top surface 113) to the final dispensing location (e.g., circuit top surface 114, second circuit top surface 212, first side 111, second side 211).

In particular embodiments, the dielectric material may be dispensed in a particular fashion based on the application of the double bonded integrated circuit 200. For example, the dielectric material may be applied to create a relatively long first dielectric surface 102 and second dielectric surface 203 for radio frequency applications. In at least one embodiment, the dispensing mechanism may dispense more than 100% of the required dielectric material. For example, the dispensing mechanism may dispense 35% more dielectric material than necessary for eventual removal to form the first dielectric surface 102, the second dielectric surface 203, and the inter-circuit dielectric surface 202. In some embodiments, dispensing the dielectric material varies by adjusting a surface tension between the dielectric material, the packaging substrate 106, the integrated circuit 101, the second integrated circuit 201, the first PCB 107, and the second PCB 108. For example, the material of the packaging substrate 106, the integrated circuit 101, and the second integrated circuit 201 may affect the surface tension of the dielectric material, which increases the length of the first dielectric surface 102 and the second dielectric surface 203. In at least one embodiment, the dispensing mechanism may vary particular conditions (e.g., volume, pressure, dispensing time) to manage the distribution of the dielectric material on the integrated circuit 101, the second integrated circuit 201, and/or the packaging substrate 106. In some embodiments, the dispensing mechanism may guide the dispensed dielectric material by building an initial dam that directs the flow of the dielectric material. For example, the dispensing mechanism may deposit an initial outline (e.g., dam) of the first dielectric surface 102, the second dielectric surface 203, and the inter-circuit dielectric surface 202 on the substrate top surface 113. Continuing this example, the dispensing mechanism may fill the initial outline of the first dielectric surface 102, the second dielectric surface 203, and the inter-circuit dielectric surface 202 with the dielectric material to form the initial dielectric material for the first dielectric surface 102, the second dielectric surface 203, and the inter-circuit dielectric surface 202.

In certain embodiments, the dielectric material solidifies by applying the UV light to the dispensed dielectric material. For example, the dielectric material may be exposed to the UV light for less than 5 seconds to form a solid compound. When solidified, the dielectric material may sustain a bond between the integrated circuit 101, the second integrated circuit 201, the packaging substrate 106, the first PCB 107, and/or the second PCB 108.

At box 503, the process 500 may include shaping the dielectric material on the first side 111 of the integrated circuit 101 to form the first dielectric surface 102, the second side 211 of the second integrated circuit 201 to form the second dielectric surface 203, and in the gap 221 to form the inter-circuit dielectric surface 202. In particular embodiments, the milling process may include removing excess dielectric material to form the first dielectric surface 102, the second dielectric surface 203, and the inter-circuit dielectric surface 202. For example, the initial deposit of the dielectric material may be shaped similarly to a dome. Continuing this example, any particular microfabrication milling system may remove the excess dielectric material to form the first dielectric surface 102 and the second dielectric surface 203 into ramps. In at least one embodiment, the ramped shape of the first dielectric surface 102 and the second dielectric surface 203 may include an angle relative to the substrate top surface 113 that measures at least 15 degrees, 15-45 degrees, 15-30 degrees, 30-45 degrees, and less than 45 degrees. In particular embodiments, the first dielectric surface 102 and the second dielectric surface 203 may have varying changes in the angle relative to the substrate top surface 113 and the. For example, the angle may begin at 15 degrees and change to 30 degrees.

In some embodiments, the microfabrication milling system removes excess dielectric material dispensed in the gap 221 to form the inter-circuit dielectric surface 202. For example, the microfabrication milling system can remove dielectric material from the gap 221 to form the inter-circuit dielectric surface 202 parallel with the circuit top surface 114, the second circuit top surface 212, and the substrate top surface 113. Continuing this example, the inter-circuit dielectric surface 202 forms a flush surface with the circuit top surface 114 and the second circuit top surface 212. In some embodiments, the microfabrication milling system may remove varying amounts of dielectric material to form distinct types of dielectric surfaces (e.g., first dielectric surface 102, second dielectric surface 203, the inter-circuit dielectric surface 202) depending on the application of the double bonded integrated circuit 200. For example, the microfabrication milling system may remove dielectric material at varying tapers to produce the first dielectric surface 102 and the second dielectric surface 103 with varying angles relative to the substrate top surface 113.

At box 505, the process 500 may include dispensing the conductive material from the first PCB 107 to the circuit top surface 114 to form the first connection 104, from the second PCB 108 to the second circuit top surface 212 to form the second connection 205, and from the circuit top surface 114 to the second circuit top surface 212 to form the inter-circuit connection 204. In some embodiments, the first connection 104 and the second connection 205 are situated on the first dielectric surface 102 and the second dielectric surface 203, respectively. For example, the first connection 104 may be dispensed from the first PCB top surface 115 to the circuit top surface 114 and rests on the first dielectric surface 102. In another example, the second connection 205 may be dispensed from the second PCB top surface 116 to the second circuit top surface 212 and rests on the second dielectric surface 203. In another example, the inter-circuit connection 204 may be dispensed from the circuit top surface 114 to the second circuit top surface 212 and rests on the inter-circuit dielectric surface 202. In at least one embodiment, the conductive material is dispensed using the ink dispensing system. In various embodiments, the ink dispensing system may use one or more computer vision techniques, algorithms, or combinations thereof to automatically locate the first dielectric surface 102, the second dielectric surface 203, and the inter-circuit dielectric surface 202. In one or more embodiments, the ink dispensing system may use one or more computer vision techniques, algorithms, or combinations thereof to automatically dispense the first connection 104, the second connection 205, and the inter-circuit connection 204.

In certain embodiments, the first connection 104, the second connection 205, and the inter-circuit connection 204 are dispensed as three sub-connections (e.g., the first sub-connection 301, the second sub-connection 302, and the third sub-connection 303 as shown in FIG. 3 and described herein). For example, the ink dispensing system may dispense the first sub-connection 301 by continuously releasing conductive material from the first PCB ground connection 311 to the first circuit ground connection 321. In some embodiments, the process may be repeated for each sub-connection of the first connection 104, the second connection 205, and the inter-circuit connection 204. For example, the integrated circuit 101 and the second integrated circuit 201 can include substantially similar coplanar waveguide structures that are interconnected with sub-connections of the inter-circuit connection 204. In at least one embodiment, the first connection 104, the second connection 205, and the inter-circuit connection 204 can include any particular number of sub-connections depending on the application of the double bonded integrated circuit 200.

In certain embodiments, the ink dispensing system dispenses the conductive material onto the first dielectric surface 102, the second dielectric surface 203, and the inter-circuit dielectric surface 202 to form the first connection 104, the second connection 205, and the inter-circuit connection 204. In some embodiments, the first dielectric surface 102, the second dielectric surface 103, and the inter-circuit dielectric surface 202 may share similar dielectric constants to the first connection 104, the second connection 205, and the inter-circuit connection 204. In at least one embodiment, matching the dielectric constant between the first connection 104, the second connection 205, the inter-circuit connection 204, the first dielectric surface 102, the second dielectric surface 203, and the inter-circuit dielectric surface 202 reduces the amount of noise produced by the first connection 104, the second connection 205, and the inter-circuit connection 204 during use.

At box 507, the process 500 may include removing a first layer of conductive material from the first connection 104, a second layer of conductive material from the second connection 205, and a third layer of conductive material from the inter-circuit connection 204. In particular embodiments, the first connection 104, the second connection 205, and the inter-circuit connection 204 can be milled to include substantially flat surfaces. For example, a micromachining tool may be employed to smoothen a top surface of the first connection 104, the second connection 205, and the inter-circuit connection 204. In various embodiments, the micromachining tool can remove a portion of conductive material to reduce the depth of the first connection 104, the second connection 205, and the inter-circuit connection 204 by 25 μm. For example, the micromachining tool may remove at least 5.0 μm, 5.0-25.0 μm, 5.0-10.0 μm, 10.0-15.0 μm, 15.0-20.0 μm, 20.0-25.0 μm, or less the 25.0 μm. In particular embodiments, when removing more than 5 μm of conductive material from the first connection 104, the second connection 205, and/or the inter-circuit connection 204, the micromachining tool removes the layer of conductive material in increments of 5.0 μm. In certain embodiments, the micromachining tool removes conductive material from the first connection 104, the second connection 205, and the inter-circuit connection 204 to reduce energy loss, form a uniform geometry for repeatable structures, and remove imperfections/errors such as the start and stop points 331. The micromachining tool may shape the first connection 104, the second connection 205, and the inter-circuit connection 204 to form tapered edges. In at least one embodiment, the tapered edges increase radio frequency performance. For example, the tapered edges may reduce noise caused by the first connection 104, the second connection 205, and the inter-circuit connection 204. Continuing this example, the tapered edges may reduce power loss and increase the resiliency of the first connection 104, the second connection 205, and the inter-circuit connection 204 to vibrations.

Figure 6:
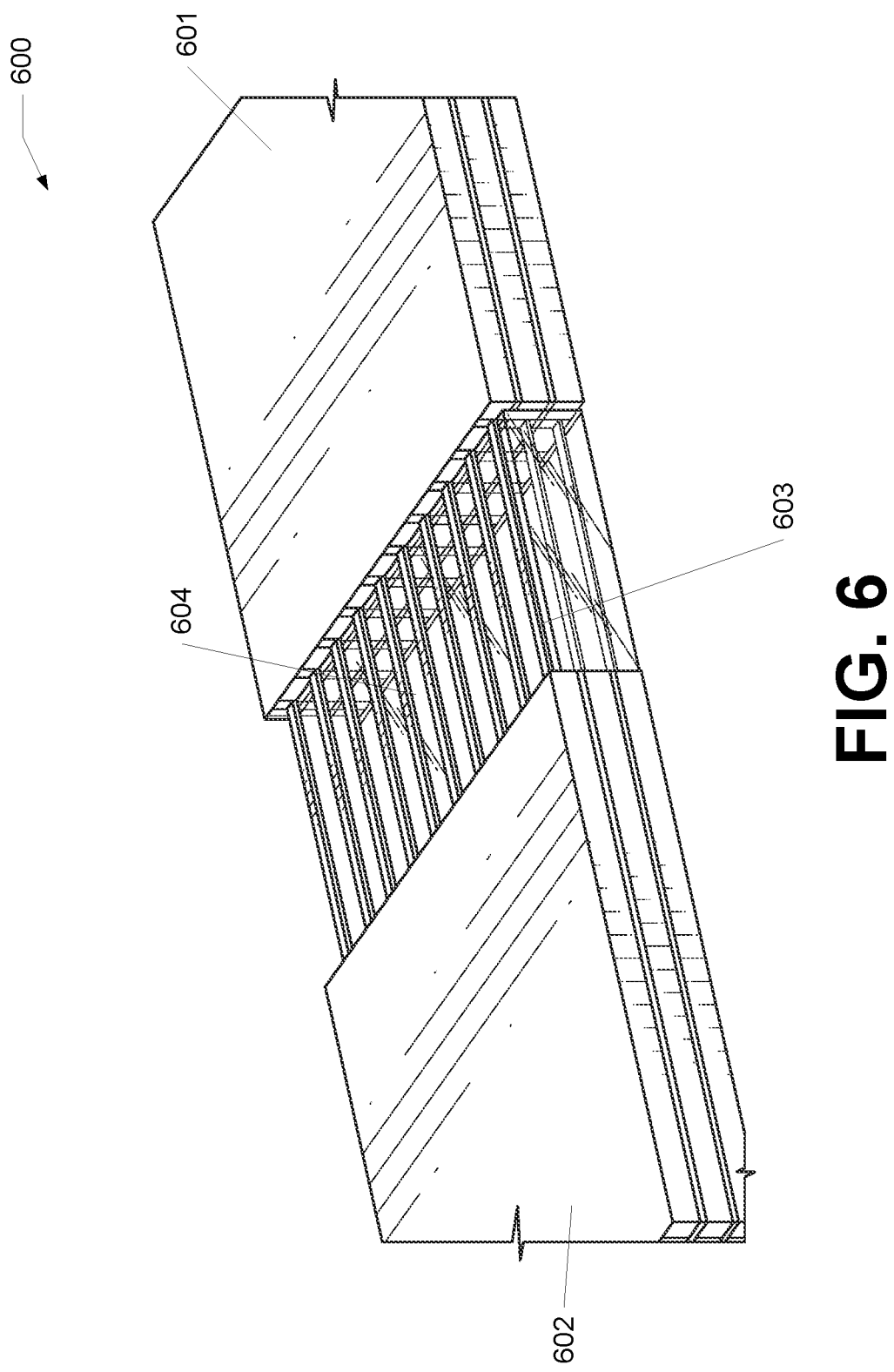
FIG. 6 illustrates a perspective view of a bonded multi-layered integrated circuit, according to one embodiment of the present disclosure.

Referring now to FIG. 6, illustrated is a first perspective view of a bonded multi-layered integrated circuit 600, according to one embodiment of the present disclosure. In some embodiments, the bonded multi-layered integrated circuit 600 includes a first stacked integrated circuit 601, a second stacked integrated circuit 602, multi-layered connections 603, and an inter-circuit dielectric surface 604. In particular embodiments, the first stacked integrated circuit 601 and the second stacked integrated circuit 602 can include at least two stacked integrated circuits. For example, the first stacked integrated circuit 601 and the second stacked integrated circuit 602 may include three vertically stacked integrated circuits. In at least one embodiment, the first stacked integrated circuit 601 and the second stacked integrated circuit 602 may include distinct stacked integrated circuits or substantially similar stacked integrated circuits.

In certain embodiments, the first stacked integrated circuit 601 and the second stacked integrated circuit 602 may connect electronically through the multi-layered connections 603. In particular embodiments, the inter-circuit dielectric surface 604 may encapsulate various levels of the multi-layered connections 603. For example, the inter-circuit dielectric surface 604 may encapsulate a first layer connection set and a second layer connection set of the multi-layered connections 603. Continuing this example, a third layer connection set of multi-layered connections 603 may be situated on the inter-circuit dielectric surface 604.

In at least one embodiment, the inter-circuit dielectric surface 604 and the multi-layer connections 603 are deposited sequentially. For example, a first layer of the inter-circuit dielectric surface 604 is deposited and milled to form a substantially flat surface. Continuing this example, the first layer connection set of the multi-layer connections 603 is deposited on the first layer of the inter-circuit dielectric surface 604 and milled to form a substantially uniform connection between the first stacked integrated circuit 601 and the second stacked integrated circuit 602. Further continuing this example, a second layer of the inter-circuit dielectric surface 604 is deposited on the first layer of the inter-circuit dielectric surface 604 and the first layer connection set of the multi-layer connections 603. In some embodiments, the process of sequentially adding layers of connections and the dielectric material is repeated for each layer of the first stacked integrated circuit 601 and the second stacked integrated circuit 602.

Figure 7:
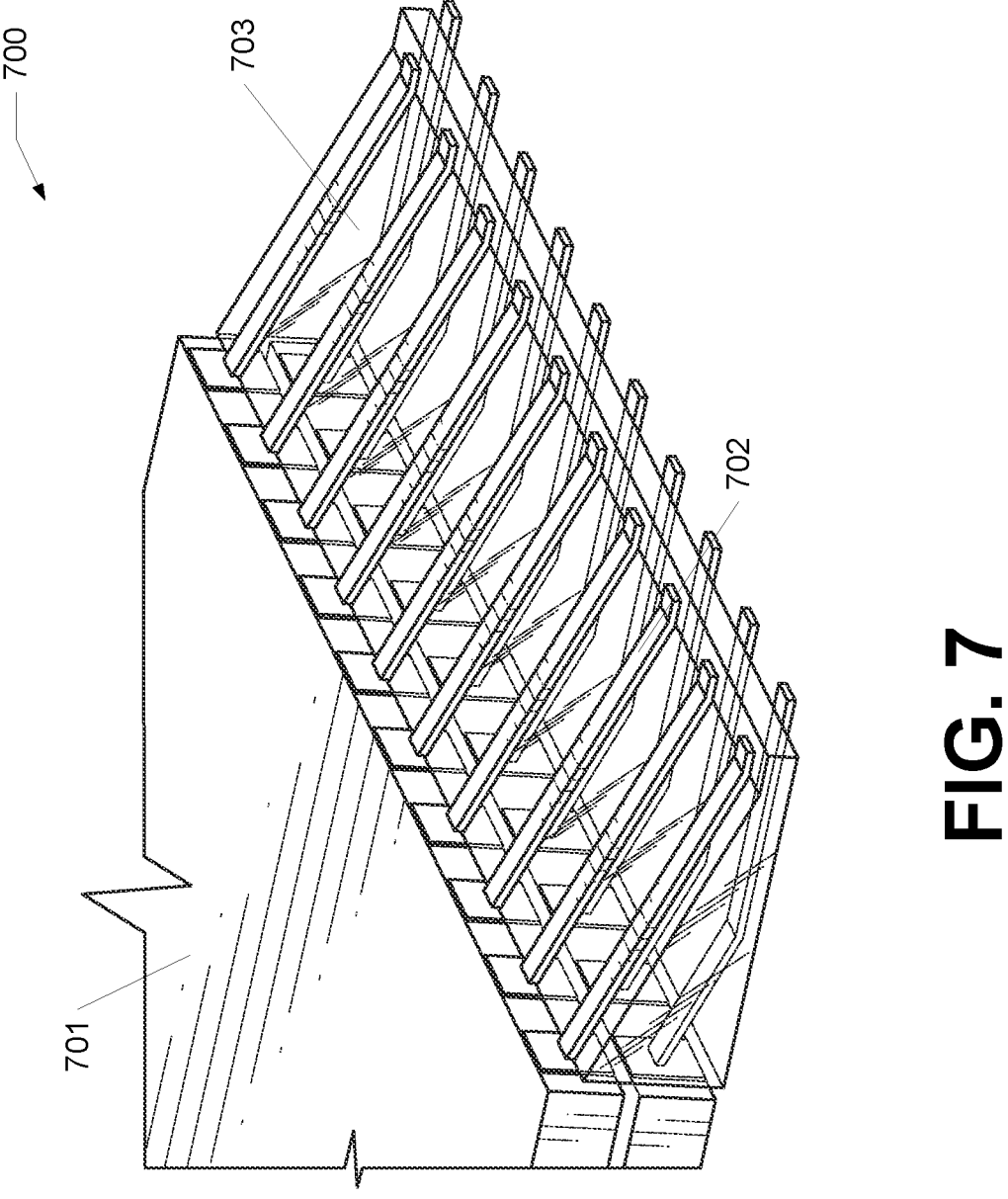
FIG. 7 illustrates a perspective view of a second bonded multi-layered integrated circuit, according to one embodiment of the present disclosure.

Referring now to FIG. 7, illustrated is a perspective view of a second bonded multi-layered integrated circuit 700, according to one embodiment of the present disclosure. In certain embodiments, the second bonded multi-layered integrated circuit 700 includes a stacked integrated circuit 701, a multi-layered connection 702, and a dielectric surface 703. In particular embodiments, the stacked integrated circuit 701 is substantially similar to the first stacked integrated circuit 601 and the second stacked integrated circuit 602 with two integrated circuits. In some embodiments, the multi-layered connection 702 connects the stacked integrated circuit 701 to a PCB, a packaging substrate, and/or any pertinent electrical connection platform. The dielectric surface 703 may partially encapsulate at least one layer of the multi-layer connection 702.

The dielectric surface 703 and the multi-layer interconnects may be deposited sequentially to form the second bonded multi-layered integrated circuit 700. In various embodiments, a first layer connection set of the multi-layered connection 702 is deposited to connect a first layer of the stacked integrated circuit 701 with the PCB, packaging substrate, and/or any pertinent electrical connection platform. In certain embodiments, the first layer connection set of the multi-layered connection 702 is milled to form substantially uniform connections. In at least one embodiment, a first layer of the dielectric surface 703 is deposited onto the first layer connection set of the multi-layered connection 702. In various embodiments, the first layer of the dielectric surface 703 is milled to form a substantially flat surface to receive a second layer connection set of the multi-layered connection 702. In particular embodiments, the second layer connection set of the multi-layered connection 702 is deposited onto the first layer of the dielectric surface 703 and milled to form uniform connections between a second layer of the stacked integrated circuit 701 and the PCB, the packaging substrate, and/or any pertinent electrical connection platform. The process of sequentially adding layers of the dielectric surface 703 and the multi-layered connections 702 may be repeated for any particular number of stacked integrated circuits.

Figure 8:
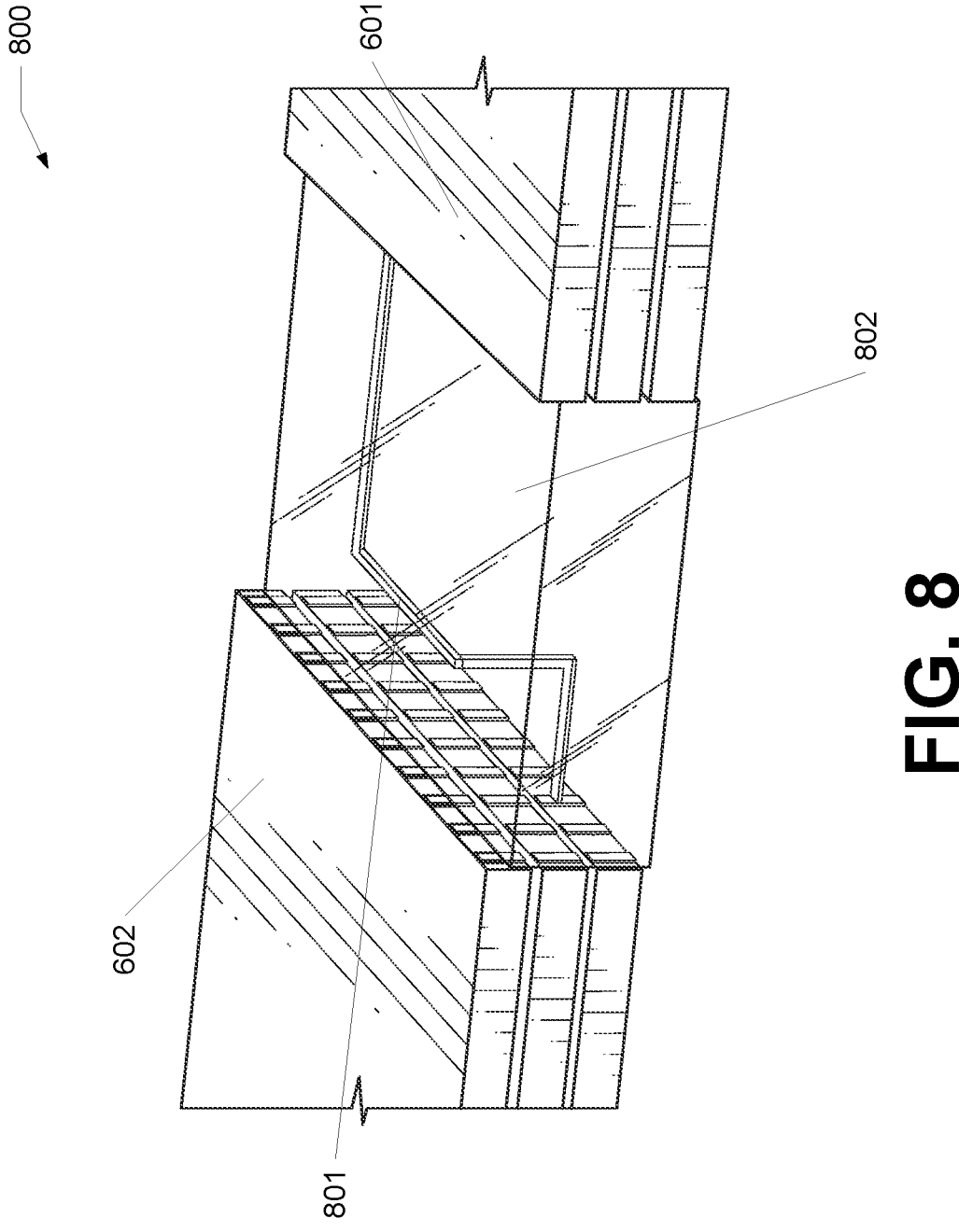
FIG. 8 illustrates a perspective view of a third bonded multi-layered integrated circuit, according to one embodiment of the present disclosure.

Referring now to FIG. 8, illustrated is a perspective view of a third bonded multi-layered integrated circuit 800, according to one embodiment of the present disclosure. In various embodiments, the third bonded multi-layered integrated circuit 800 is substantially similar to the bonded multi-layered integrated circuit 600 with three-dimensional routed connections 801. In one or more embodiments, the three-dimensional routed connection 801 connects the first stacked integrated circuit 601 to the second stacked integrated circuit 602. In various embodiments, the three-dimensional routed connections 801 can connect any particular layer of the first stacked integrated circuit 601 to any particular layer of the second stacked integrated circuit 602. In various embodiments, the three-dimensional routed connections 801 are dispensed and encapsulated by an inter-circuit dielectric portion 802. In certain embodiments, the inter-circuit dielectric portion 802 is illustrated transparently to provide a view of the one or more three-dimensional routed connections 801. In at least one embodiment, the inter-circuit dielectric portion 802 and the three-dimensional routed connections 801 are sequentially formed to create the third bonded multi-layered integrated circuit 800. In certain embodiments, the inter-circuit dielectric portion 802 is deposited and milled to include vacancies. Vacancies may be defined as a void within the inter-circuit dielectric portion 802 that form a path between the first stacked integrated circuit 601 and the second stacked integrated circuit 602. In particular embodiments, the vacancies of the inter-circuit dielectric portion 802 are filled with conductive material to form the three-dimensional routed connections 801.

While various aspects have been described in the context of a preferred embodiment, additional aspects, features, and methodologies of the claimed inventions will be readily discernible from the description herein, by those of ordinary skill in the art. Many embodiments and adaptations of the disclosure and claimed inventions other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed inventions. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed inventions. In addition, some steps may be carried out simultaneously, contemporaneously, or in synchronization with other steps.

The embodiments were chosen and described in order to explain the principles of the claimed inventions and their practical application so as to enable others skilled in the art to utilize the inventions and various embodiments and with various modifications as are suited to the particular use contemplated. Alternative embodiments will become apparent to those skilled in the art to which the claimed inventions pertain without departing from their spirit and scope. Accordingly, the scope of the claimed inventions is defined by the appended claims rather than the foregoing description and the exemplary embodiments described therein.

What is claimed is:

1. A method comprising:

dispensing a dielectric material on a first side of a first integrated circuit and in a gap between the first integrated circuit and a second integrated circuit;

shaping the dielectric material on the first side of the first integrated circuit to form a first dielectric surface and in the gap in between the first integrated circuit and the second integrated circuit to form an inter-circuit dielectric surface; and dispensing a conductive material from a first PCB top surface to a first top surface of the first integrated circuit to form a first connection and from the first top surface to a second top surface of the second integrated circuit over the inter-circuit dielectric surface to form an inter-circuit connection.

2. The method of claim 1, further comprising:

dispensing the dielectric material on a second side of the second integrated circuit;

shaping the dielectric material on the second side of the second integrated circuit to form a second dielectric surface; and dispensing the conductive material from a second PCB top surface to the second top surface of the second integrated circuit to form a second connection, the second connection situated on the second dielectric surface.

3. The method of claim 1, further comprising removing a first layer from the first connection and second layer from the inter-circuit connection by subtracting a portion of the conductive material, the portion equating to a depth of 0.005 to 0.065 millimeters.

4. The method of claim 1, further comprising situating the first integrated circuit and the second integrated circuit on a packaging substrate, the packaging substrate comprising a metal substrate, a ceramic substrate, a composite substrate, a polymer substrate, a hydrocarbon substrate, or any one combination thereof.

5. The method of claim 4, wherein shaping the dielectric material further comprises:

shaping the first dielectric surface to extend from the packaging substrate to the first top surface of the first integrated circuit at a first angle in a range of 15 degrees to 45 degrees relative to a substrate top surface of the packaging substrate; and shaping the inter-circuit dielectric surface to extend from the first top surface of the first integrated circuit to the second top surface of a second integrated surface at a second angle parallel to the substrate top surface of the packaging substrate.

6. The method of claim 4, wherein dispensing the dielectric material further comprises positioning a dispensing nozzle a first distance from the packaging substrate and a second distance from the first integrated circuit, the first distance measuring 25 m from the packaging substrate and the second distance measuring 25 m from the first integrated circuit, wherein the dispensing nozzle having a diameter of 0.05 mm-0.25 mm and wherein the dispensing nozzle dispenses the dielectric material at a dispensing pressure of 5-10 psi.

7. The method of claim 1, wherein the first integrated circuit comprises a first monolithic microwave integrated circuit with a first integrated coplanar waveguide structure and the second integrated circuit comprises a second monolithic microwave integrated circuit with a second integrated coplanar waveguide structure.

8. The method of claim 7, wherein the first integrated coplanar waveguide structure extends across the first top surface of the first integrated circuit and comprises a first ground conductor and a second ground conductor separated by a first microstrip conductor.

9. The method of claim 8, wherein the second integrated coplanar waveguide structure extends across the second top surface of the second integrated circuit and comprises a third ground conductor and a fourth ground conductor separated by a second microstrip conductor.

10. The method of claim 9, wherein dispensing the conductive material to form the inter-circuit connection, further comprises:

dispensing a fourth sub-connection between the first ground conductor and the third ground conductor;

dispensing a fifth sub-connection between the second ground conductor and the fourth ground conductor; and dispensing a sixth sub-connection between the first microstrip conductor and the second microstrip conductor.

11. The method of claim 8, wherein dispensing the conductive material to form the first connection, further comprises:

dispensing a first sub-connection between the first PCB top surface and the first ground conductor;

dispensing a second sub-connection between the first PCB top surface and the second ground conductor; and dispensing a third sub-connection between the first PCB top surface and the first microstrip conductor.

* * * * *